United States Patent
Ban et al.

[11] Patent Number: 6,165,050
[45] Date of Patent: *Dec. 26, 2000

[54] METHOD OF MANUFACTURING SEMICONDUCTOR DEVICE USING PRECISION POLISHING APPARATUS WITH DETECTING MEANS

[75] Inventors: Mikichi Ban, Miura; Matsuomi Nishimura, Omiya; Kazuo Takahashi, Kawasaki, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/303,647

[22] Filed: May 3, 1999

Related U.S. Application Data

[62] Division of application No. 08/851,538, May 5, 1997.

[30] Foreign Application Priority Data

May 10, 1996 [JP] Japan .................................. 8-141101

[51] Int. Cl.[7] ........................................... B24B 49/00
[52] U.S. Cl. .............................. 451/8; 438/692; 438/693; 451/41; 451/54; 451/66; 451/57; 451/288
[58] Field of Search .............................. 451/5, 8, 41, 53, 451/54, 63, 66, 67, 57, 285, 286, 287, 288, 289, 290, 449, 451; 438/690, 691, 692, 693

[56] References Cited

U.S. PATENT DOCUMENTS

| | | | |
|---|---|---|---|
| 1,585,515 | 5/1926 | Schaal | 451/451 X |
| 2,304,071 | 12/1942 | Bollinger | 451/451 X |
| 4,680,893 | 7/1987 | Cronkhite et al. | 451/41 X |
| 4,956,944 | 9/1990 | Ando et al. . | |
| 5,333,413 | 8/1994 | Hashimoto | 451/287 X |
| 5,399,233 | 3/1995 | Murazumi et al. . | |
| 5,545,076 | 8/1996 | Yun et al. | 451/287 |
| 5,616,212 | 4/1997 | Isobe | 438/693 |
| 5,653,623 | 8/1997 | Kimura et al. | 451/72 |
| 5,655,954 | 8/1997 | Oishi et al. | 451/67 |
| 5,679,055 | 10/1997 | Greene et al. | 451/10 |
| 5,679,059 | 10/1997 | Nishi et al. | 451/41 |
| 5,679,060 | 10/1997 | Leonard et al. | 451/43 |

FOREIGN PATENT DOCUMENTS

| | | |
|---|---|---|
| 2-257629 | 10/1990 | Japan . |
| 6-252110 | 9/1994 | Japan . |

*Primary Examiner*—Timothy V. Eley
*Attorney, Agent, or Firm*—Fitzpatrick, Cella, Harper & Scinto

[57] ABSTRACT

In order to reclaim defective articles, wafers carried in from a loading unit are transported to a wafer stocker unit, a polishing unit, a pre-rinsing unit, a rinsing unit, a spin dehydrating unit and a drying unit in the named order, and in a defect inspecting device, defective articles are sorted and the remainder are taken out of an unloading unit as products. The defective articles are classified in a discriminating device in conformity with the kinds of defects and are returned to the polishing unit, the rinsing unit or the drying unit through a return duct.

5 Claims, 10 Drawing Sheets

METHOD OF MANUFACTURING SEMICONDUCTOR DEVICE USING PRECISION POLISHING APPARATUS WITH DETECTING MEANS

This is a divisional application of application Ser. No. 08/851,538, filed May 5, 1997.

BACKGROUND OF THE INVENTION

1. Field of the Invention

This invention relates to a precision polishing apparatus for highly accurately polishing the surface of a substrate, such as a wafer on which dielectric material layers of $SiO_2$ or the like are laminated, for use in manufacturing a semiconductor device. This invention also relates to a semiconductor device manufacturing method using the precision polishing apparatus.

2. Related Background Art

In recent years, the minutia of semiconductor devices has advanced, and accuracy on submicron order has been required for line widths of minute patterns. Along with this, the technique of highly accurately flattening the surface of a substrate such as a wafer on which wiring or dielectric material layers are laminated has become necessary, and a precision polishing apparatus adopting a polishing method called mechanochemical polishing, chemical-mechanical polishing, mechano-chemical wrapping or the like has been developed.

Referring to FIG. 14 of the accompanying drawings which shows a precision polishing apparatus according to the prior art, this apparatus has a polishing head 102 for adsorbing and holding a pair of wafers $W_0$ in such a manner that the polished surfaces thereof face downward and conveying them along a guide 101, a loading portion 103 and a wafer centering portion 104 disposed in series in the direction of conveyance of the wafers, a polishing portion 105 for rotating a polishing pad 105a on a stool, a wafer rinsing portion 106, a wafer reversing portion 107 and an unloading portion 108.

Wafers $W_0$ contained in a loading cassette $G_1$ and carried in from the preceding step are taken out of the loading cassette $G_1$ in the loading portion 103 and are subjected to centering in the centering portion, whereafter the wafers are adsorbed by the polishing head 102 and conveyed to the polishing portion 105. In the polishing portion 105, each wafer $W_0$ is lightly urged against the surface of the rotating polishing pad 105a, and the polishing head 102 is caused to cross along the diameter of the polishing pad 105a to thereby polish the lower surface (the polished surface) of each wafer $W_0$. The polishing head 102 which has crossed the polishing pad 105a is continuously moved along the guide 101 and arrives at the wafer rinsing portion 106, where rinsing liquid is blown from nozzles 106a against the polished surfaces of the wafers $W_0$ to thereby remove any byproduct of polishing. The wafer reversing portion 107 reverses the rinsed wafers $W_0$ and transports them to the unloading portion 108. In the unloading portion 108, the wafers $W_0$ are received into an unloading cassette $G_2$ and sent out to the next step.

The polishing head 102 is suspended from a top frame 102a movable above the wafer centering portion 104, the polishing portion 105, the wafer rinsing portion 106, etc., and one end of the top frame 102a is supported for reciprocal movement along the guide 101 and the other end of the top frame 102a is connected to a driving portion 102b. The top frame 102a having the polishing head 102 suspended therefrom is reciprocally moved along the guide 101 by the driving portion 102b. The polishing portion 105 has a brushing device 105b and a hand shower 105c for cleaning the surface of the polishing pad 105a.

As described above, design is made such that the polishing and succeeding rinsing step of the wafers $W_0$ continuously sent in from the preceding step are automatically executed and the wafers are sent to the next step. Also, the work of cleaning the surface of the polishing pad 105a can be done efficiently during the time when the polishing head 102 moves in the opposite direction and returns from the unloading portion 108 to the loading portion 103.

On the other hand, FIG. 15 of the accompanying drawings is a flow chart showing the polishing process described in Japanese Patent Application Laid-Open No. 2-257629.

Specifically, a semiconductor substrate (bare silicon wafer) subjected to primary polishing which is rough polishing is rinsed and dried, whereafter the measurement of the polished state as to whether the semiconductor substrate has unevenness of a predetermined value or greater is effected. Only a semiconductor substrate free of unevenness of a predetermined value or greater is sent to secondary polishing which is finishing polishing, and a semiconductor substrate having unevenness is subjected to partial polishing which will be described later.

That is, the semiconductor substrate subjected to primary polishing usually has more or less unevenness on the surface thereof due to the properties of the polishing cloth or the properties of the semiconductor substrate itself or the irregularity of the pressure force. If the degree of the unevenness is such as being capable of being normally subjected to secondary polishing, there will be no hindrance even if the semiconductor substrate is sent to the secondary polishing step. However, if the unacceptable unevenness is not changed even by secondary polishing or it is foreseen for the unevenness to further become unacceptable, some treatment should be adopted before the semiconductor substrate is sent to the secondary polishing step. So, this example of the prior art is such that whether there is unacceptable unevenness is determined and if there is unacceptable unevenness, the semiconductor substrate is subjected to partial polishing as described above.

The above-mentioned measurement of the polished state is accomplished as follows. When there are recesses and projections on the polished surface of the semiconductor substrate, the position, area, height, etc. of the projection form an interference fringe, for example, by a laser, and this interference fringe is analyzed to detect the position, area and height of each region. On the basis of this analysis, the polishing head is controlled or contour lines are put out by image processing or the like. Specifically, the measurement is effected in such a manner that the surface configuration accuracy of the semiconductor substrate is measured with the back thereof as the standard.

Thus, measurement of the polished state is effected, and any semiconductor substrate of unacceptable polish accuracy is sent to the partial polishing step which will be described next.

This partial polishing step partially polishes only a projection to an allowable height when the projection has an unacceptable height.

Specifically, the result of the accuracy measurement and an actual semiconductor substrate are made to correspond to 1:1, and, as shown in FIG. 16 of the accompanying drawings, the semiconductor substrate 301 is fixedly held on a stool 305, and a small polishing head 304 is controlled and moved by the NC control system correspondingly to the result of the accuracy measurement. The shape of a polishing pad 303 attached to the lower surface of the polishing head 304 may preferably be a circle of which the diameter is 1/10 to 1/20 of the diameter of the semiconductor substrate. The polishing movement is effected by moving the polishing head back and forth and right and left in a horizontal direction while being rotated. The partial polishing may preferably be done with the polished surface facing downward to prevent attack of the semiconductor substrate by polishing liquid (slurry). Thus, the projection on the semiconductor substrate 301 is scraped off by a predetermined amount and rinsed, and the accuracy measurement is effected. By this accuracy measurement, only a semiconductor substrate having acceptable surface polish accuracy is sent to secondary polishing. On the other hand, a semiconductor substrate of unacceptable surface polish accuracy even with the partial polishing is sent to partial polishing.

The above-described example of the prior art may be suitable for a case of relatively large recesses and projections, where the projections are flatly polished with the back of a semiconductor wafer as the standard as when the semiconductor wafer before a semiconductor device is manufactured is to be polished.

However, in the case of polishing a metallic film which is wiring or polishing an inter-layer insulating film, it is not always good if the surface only becomes flat with the back of the wafer as the standard. Rather such polishing is sometimes desired that the same film thickness is provided following the wiring pattern on the ground or the recess and projection of the transistor portion. When the wafer is subjected to such polishing, the polished state of the surface of the wafer creates minute recesses and projections. Accordingly, the alternative to effect partial polishing or effect secondary polishing after determination as in the example of the prior art cannot be said to be suitable for polishing a substrate on which an element such as a transistor is formed.

Also, in the example of the prior art, a hard foreign substance may attach to the pad during the steps of secondary polishing and tertiary polishing to create a new flaw.

So, we have tried a method of manually returning a wafer whose defect has been detected to the primary polishing portion and repeating all the above-described steps, or adding a wafer defect removing device to the downstream side of the tertiary polishing station, and effecting the re-polishing or rinsing of the wafer there to thereby reclaim the defective wafer.

However, it has been found that the defect of a wafer detected by inspection is often, in addition to a flaw on the polished surface requiring re-polishing, a stain by the attachment of polishing byproduct such as polishing powder or simply the remaining of rinsing liquid due to insufficient drying at the final step, and does not always need re-polishing.

If as described above, a wafer which does not require re-polishing is manually returned to the primary polishing portion of the precision polishing apparatus or manually sent into the wafer defect removing device discrete from the polishing apparatus and re-polished, a new defect may be created at the re-polishing step and throughput may be reduced due to the addition of an unnecessary polishing step. As a result, the manufacturing cost of a semiconductor device or the like rises.

SUMMARY OF THE INVENTION

It is an object of the present invention to provide a precision polishing apparatus and a semiconductor device manufacturing method which can precision-polish at a high throughput to thereby reduce the manufacturing cost of a semiconductor device.

It is another object of the present invention to provide a precision polishing apparatus of high productivity and a semiconductor device manufacturing method which can continuously and automatically effect the polishing, rinsing, etc. of a workpiece such as a wafer and can detect any defect of a product in the apparatus and select a step necessary for reclamation and automatically return the workpiece to the step.

The precision polishing apparatus of the present invention is characterized by the provision of a polishing unit having polishing means for polishing a workpiece, a rinsing unit for rinsing the workpiece transported from the polishing unit, detecting means for detecting the state of the polished surface of the workpiece rinsed by the rinsing unit, and selectively returning means for selectively returning the workpiece to the polishing unit or the rinsing unit in conformity with the result of the detection by the detecting means.

Also, the precision polishing apparatus of the present invention is characterized by the provision of a polishing unit having polishing means for polishing a workpiece, a rinsing unit for rinsing the workpiece transported from the polishing unit, a drying unit for drying the workpiece transported from the rinsing unit, detecting means for detecting the state of the polished surface of the workpiece dried by the drying unit, and selectively returning means for selectively returning the workpiece to the polishing unit or the rinsing unit in conformity with the result of the detection by the detecting means.

Further, the precision polishing apparatus of the present invention is characterized by a first unit, a second unit provided with polishing means for polishing a workpiece transported from the first unit, a third unit for rinsing the workpiece transported from the second unit, a fourth unit for drying the workpiece transported from the third unit, defect inspecting means for detecting any defect of the workpiece transported from the fourth unit and assorting a defective article, and selectively returning means for selectively returning the defective article to one of the first and the fourth units.

The state of the polished surface of the workpiece such as a wafer after the drying step, i.e., whether there is any defect such as a flaw or a stain on the polished surface of the workpiece, is inspected, and only an article free of any defect is taken as a product out of the apparatus. The defective article for which the defect has been detected is analyzed as to whether the defect is a flaw of the polished surface or a stain caused by polishing powder or the like rinsing liquid. If the defect is a flaw of the polished surface, the defective article is returned to the polishing unit. If the defect is a stain caused by polishing powder or the like, the defective article is returned to the rinsing unit. If the defect is a stain caused by rinsing liquid as required, the defective article is returned to the drying unit.

Thus, the defective article is returned to a necessary step in conformity with the kind of defect, and the defect is removed to thereby reclaim the defective article as a product.

There is no possibility that a defective article or articles are included among the products yielded from the precision polishing apparatus and therefore, the automation of the next step for the workpiece is easy. That is, this can greatly contribute to the automation or the like of the manufacturing process for semiconductor devices or the like.

If in the reclamation of defective articles, the polishing step is unnecessary, this can be omitted and therefore, the productivity of the precision polishing apparatus can be improved, and the average unit cost of the products can be greatly reduced.

If the precision polishing apparatus is provided with hermetically sealing means for individually hermetically sealing the atmospheres in the respective units, and atmosphere pressure control means for controlling the atmosphere pressure in each unit to a value lower than the outside atmosphere pressure, any foreign substances in the apparatus will be hampered from diffusing into a clean room.

Further, if intermediate defect inspecting means and intermediate returning means are provided between the polishing unit and the rinsing unit and between the rinsing unit and the drying unit, the wasteful rinsing step and drying step can be omitted by the early detection of defective articles and the productivity of the precision polishing apparatus can be more improved. As a result, the manufacturing cost of semiconductor devices or the like can be further reduced.

DESCRIPTION OF THE PREFERRED EMBODIMENTS

The basic structure of a precision polishing apparatus according to the present invention and a polishing method using the same will hereinafter be described with reference to FIGS. 1 and 2.

Figure 1:
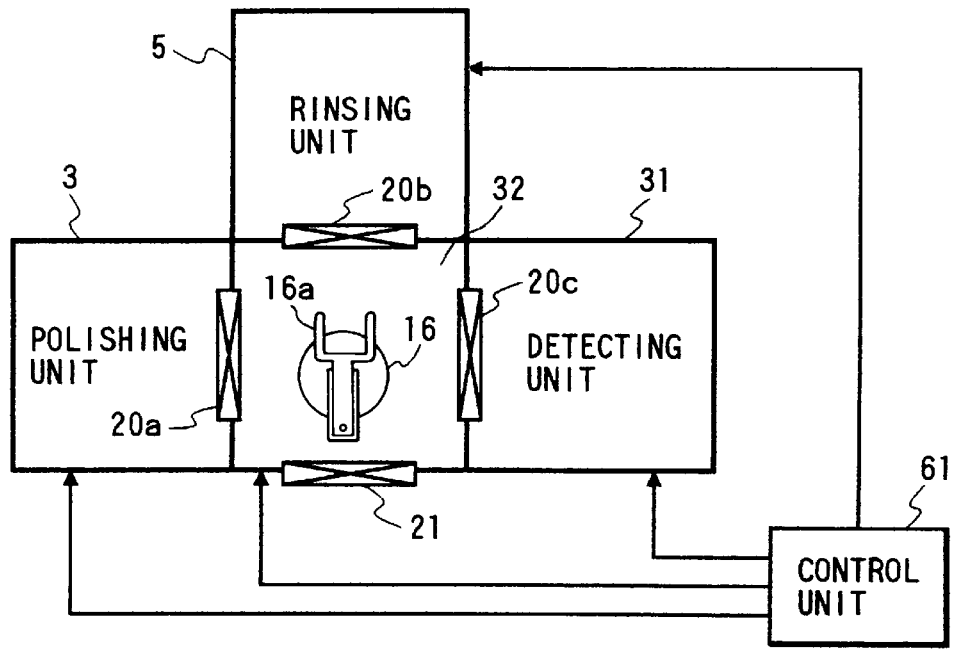
FIG. 1 is a model view showing the basic structure of a precision polishing apparatus according to the present invention.

FIG. 1 is a model view showing the basic structure of the precision polishing apparatus of the present invention.

This apparatus has four units partitioned by partition walls.

The reference numeral 3 designates a polishing unit having polishing means for polishing a workpiece, the reference numeral 5 denotes a rinsing unit for rinsing the workpiece transported from the polishing unit 3, and the reference numeral 31 designates a detecting unit which is detecting means for detecting the state of thus polished surface of the workpiece.

The reference numeral 32 denotes a conveying unit as selectively returning means for selectively returning the workpiece to one of the polishing unit 3 and the rinsing unit 5 in conformity with the result of the detection of the state of the polished surface of the workpiece by the detecting unit 31. The conveying unit 32 is provided with a conveying robot 16 having an arm 16a. The reference characters 20a, 20b and 20c designate opening-closing means provided between the conveying unit (conveying chamber) 32 and the processing chambers of the units 3, 5 and 31, and the reference numeral 21 denotes opening-closing means provided between the conveying chamber and a clean room in which there is an operator.

The reference numeral 61 designates a control circuit for controlling the processing in the units 3, 5 and 31, the opening-closing operations of the opening-closing means 20a, 20b, 20c and 21 and the operation of a conveying robot.

The polishing unit 3 may preferably be provided with exhaust means for exhausting air from the polishing unit 3. Further, the rinsing unit 5 and the detecting unit 31 may also be provided with exhaust means for exhausting air from those units 5 and 31.

When the air in the polishing unit 3 can be exhausted to maintain the interior of the polishing unit 3 at a pressure somewhat lower than that in the conveying chamber 32, the opening-closing means 20a need not be provided. Likewise, the opening-closing means 20b, 20c and 21 can be omitted as required. If the conductance of the communicating portion between the polishing unit 3 and the conveying chamber 32 and the conductance of the communicating portion between the rinsing unit 5 and the conveying chamber 32 are appropriately determined, there can be provided conditions that $P_3<P_{32}$ and that $P_{32}<P_C$ simply by exhausting air from the polishing unit 3 when $P_3$ is the pressure in the polishing unit 3, $P_{32}$ is the pressure in the conveying chamber 32, $P_5$ is the pressure in the rinsing unit 5 and $P_C$ is the pressure in the clean room. More preferably, the rinsing unit 5 may also be provided with exhaust means to thereby provide $P_5<P_{32}$ and $P_{32}<P_C$.

Figure 2:
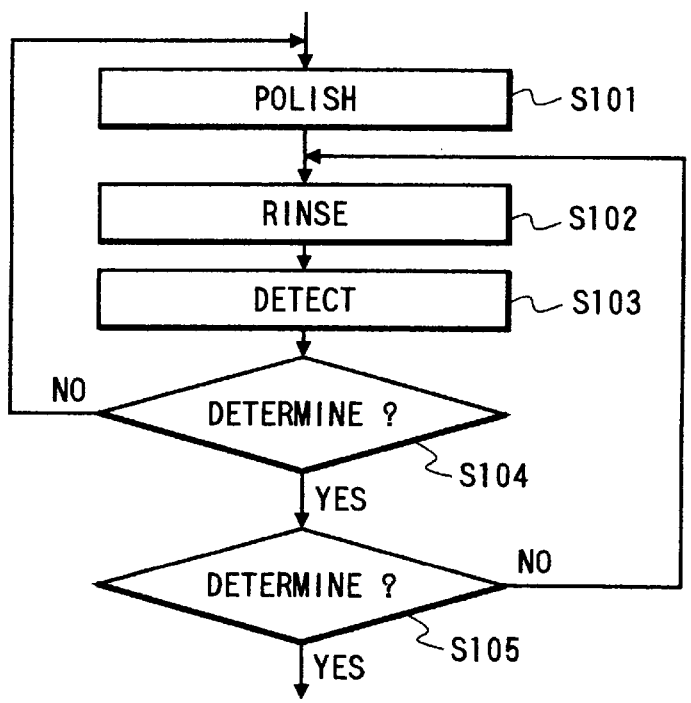
FIG. 2 is a flow chart showing the basic steps of a polishing method according to the present invention.

FIG. 2 is a flow chart for illustrating the basic steps of the polishing method of the present invention.

First, a cassette (not shown) containing wafers as workpieces therein is disposed in front of the opening-closing means 21, and the control circuit 61 is operated to start the polishing operation.

The conveying robot 16 introduces a wafer from the cassette into the conveying chamber 32. The opening-closing means 20a is opened, the wafer is disposed in the polishing unit, and then the opening-closing means 20a is closed. Thus, the polishing of the wafer is effected in the polishing unit 3 (S101).

Next, when the polishing is terminated, the opening-closing means 20a is opened, and the conveying robot 16 takes out the polished wafer from the polishing unit 3 into the conveying chamber 32. The opening-closing means 20b is then opened, the polished wafer is transported into the rinsing unit 5, and then the opening-closing means 20b is closed. Thus, the rinsing of the polished wafer is effected in the rinsing unit 5 (S102).

After termination of the rinsing, the opening-closing means 20b is opened, the rinsed wafer is once taken out into the conveying chamber 32, the opening-closing means 20c is opened, and the wafer is transported into the detecting unit 31, where the detection of the state of the surface, i.e., the polished surface, of the wafer is effected (S103).

In conformity with the result of the detection, whether there is any flaw on the polished surface of the wafer is determined, and if it is determined that there is a flaw, the wafer is transported to the polishing unit 3 to return the wafer to the polishing step S101 (S104).

If it is determined that there is no flaw, whether there is attachment of slurry is determined, and if it is determined that there is attachment, the wafer is transported to the rinsing unit 5 to return the wafer to the rinsing step S102 without returning it to the polishing step (S105).

Only the wafer that has thus passed through the step S105 is returned from the conveying chamber 32 into the cassette. Of course, when the opening-closing means 20a, 20b and 20c are omitted, the opening and closing operations become unnecessary.

Figure 3:
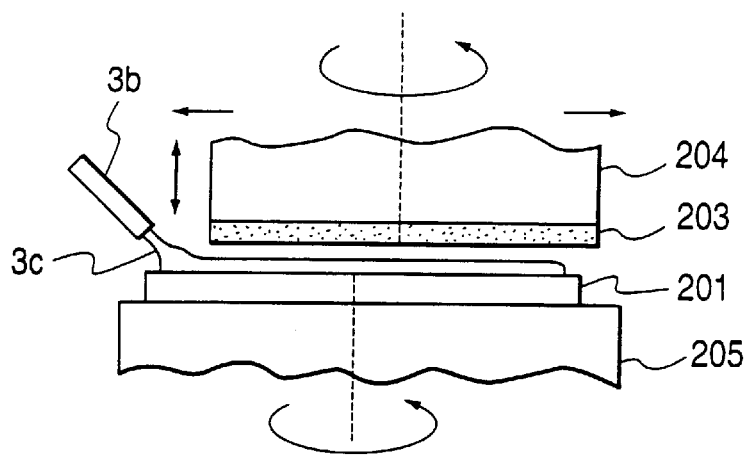
FIG. 3 is a model view showing an example of polishing means used in the precision polishing apparatus of the present invention.

FIG. 3 shows the essential portions of polishing means used in the polishing unit 3. The wafer 201 as a workpiece is disposed on a rotatable stool 205 and rotates with the stool 205.

A polishing pad 203 is fixed to the underside of a polishing head 204 and is designed so as to be capable of rotating and oscillating. During polishing, the head 204 lowers and the head 204 is reciprocally moved along the polished surface of the wafer while the pad 203 and the wafer 201 are rotated with the lower surface of the pad 203 urged against the upper surface (polished surface) of the wafer 201. The polishing of the upper surface of the wafer 201 will be done if the above-described operation is performed while slurry 3c as a polishing agent is supplied between the lower surface of the pad 203 and the upper surface of the wafer.

As the surface capable of being polished by the polishing apparatus of the present invention, mention may be made of insulating film (dielectric material film) of silicon oxide, silicon nitride, tantalum oxide, aluminum oxide or the like, or metallic film such as aluminum, copper, tungsten, molybdenum, aluminum silicon, aluminum silicon copper or the like, or a surface in which an insulating material and a metal exist mixedly.

As the polishing agent (slurry) usable in the present invention, use is made of a liquid having fine particles of silicon oxide, aluminum oxide, cerium oxide, manganese dioxide or the like having a diameter of 1–1000 $\mu$m. As this liquid, use can be made of an aqueous solution of KOH, NaOH, $NH_4$, isocyanuric acid or the like. Although the polishing of the present invention is chemical-mechanical polishing, there are many unknown points in the chemical action thereof. Therefore, the present invention does not exclude cases where polishing is not accomplished by chemical action, but rather by only physical action (mechanical action).

Figure 4:
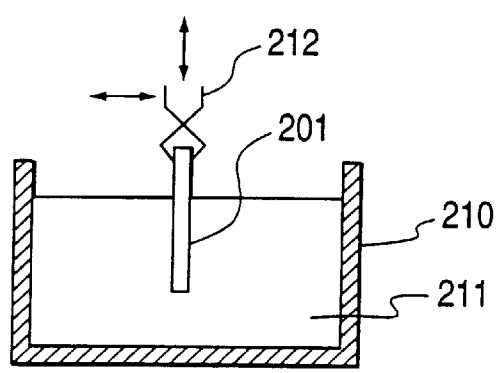
FIG. 4 is a model view showing an example of rinsing means used in the precision polishing apparatus of the present invention.
Figure 5:
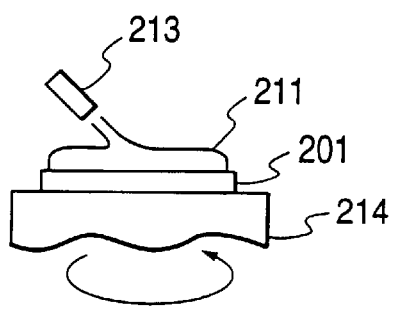
FIG. 5 is a model view showing another example of rinsing means used in the precision polishing apparatus of the present invention.
Figure 6:
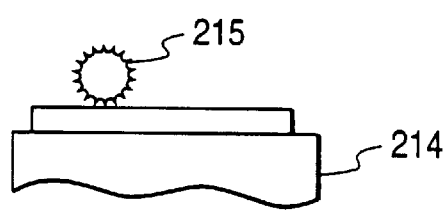
FIG. 6 is a model view showing still another example of rinsing means used in the precision polishing apparatus of the present invention.

FIGS. 4, 5 and 6 show the essential portions of rinsing means used in the rinsing unit 5.

FIG. 4 shows a device having a liquid tank 210 containing a rinsing liquid 211 therein, and using a conveying arm 212 to immerse the wafer 201 into the rinsing liquid 211 such as pure water, and imparting an ultrasonic wave or the like to the rinsing liquid to thereby effect wet rinsing.

FIG. 5 also shows a kind of wet rinsing device which is a spin rinsing device carrying the wafer 201 on rotatable wafer holding means 214 and supplying the rinsing liquid 211 from a nozzle 213 while rotating the wafer 201.

FIG. 6 shows a scrub rinsing device for scrubbing the upper surface (polished surface) of a wafer 215 placed on wafer holding means 214 by a nylon brush or the like.

The rinsing unit 5 can be comprised of at least one of the devices of FIGS. 4 to 6 disposed in a hermetically sealed chamber.

When wet rinsing using a rinsing liquid is to be effected, drying means for supplying warm air or cold air may be provided integrally with or discretely from the rinsing unit.

Figure 7:
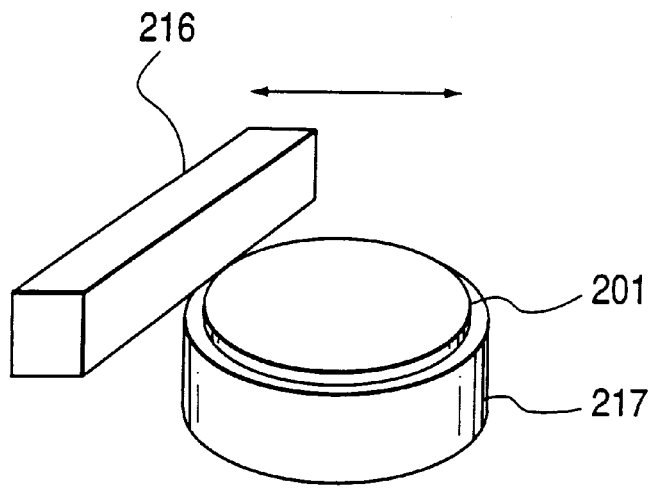
FIG. 7 is a model view showing an example of detecting means used in the precision polishing apparatus of the present invention.

FIG. 7 shows detecting means used in the detecting unit to detect the state of the polished surface.

The wafer 201 is placed on a table 217 with the polished surface thereof turned upward. A line sensor 216 having a light source and a sensor array comprising a number of photoelectric conversion elements arranged in a row is scanned in the directions of the bilateral arrow, whereby a minute pattern on the polished surface can be detected by the difference in contrast.

When slurry attaches to the polished surface, the attachment shape of the slurry is often such that the ratio between the length and width thereof is approximately 1. On the other hand, the flaw on the polished surface is often in the form of an elongated line, and the ratio between the length and width of this flaw is sufficiently greater than 1. Accordingly, whether the slurry is causing a flaw can be determined from the shape of a detected pattern.

Figure 8:
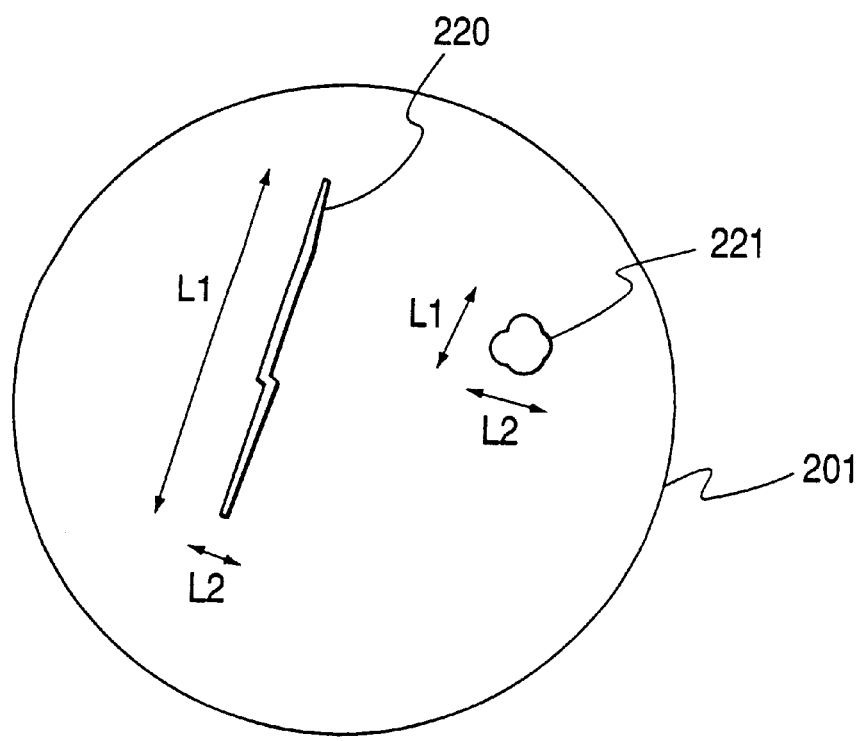
FIG. 8 is a model view showing a flaw on a wafer and the state of slurry attaching thereto.

FIG. 8 shows the shapes of a flaw 220 on the wafer 201 and the slurry 221.

When the lengthwise dimension of the detected pattern is defined as L1 and the widthwise dimension of the detected pattern is defined as L2, if L1/L2<2, the pattern is identified as slurry, and if L1/L2≧2, this pattern is determined as a flaw. On the basis of this judgment, the wafer is returned to one of the polishing unit 3 and the rinsing unit 5.

Further, if a well-known wafer inspecting apparatus is used, the attachment of the rinsing liquid to the wafer can also be detected.

Description will now be made of a semiconductor device manufacturing method adopting the above-described polishing method.

The substrate having insulating film and/or metallic film on the upper surface thereof as the workpiece used in the present invention is a silicon wafer, a compound semiconductor wafer, SOI wafer, an insulating substrate having a semiconductor layer, or the like.

Description will hereinafter be made with a silicon wafer taken as an example.

Figure 9:
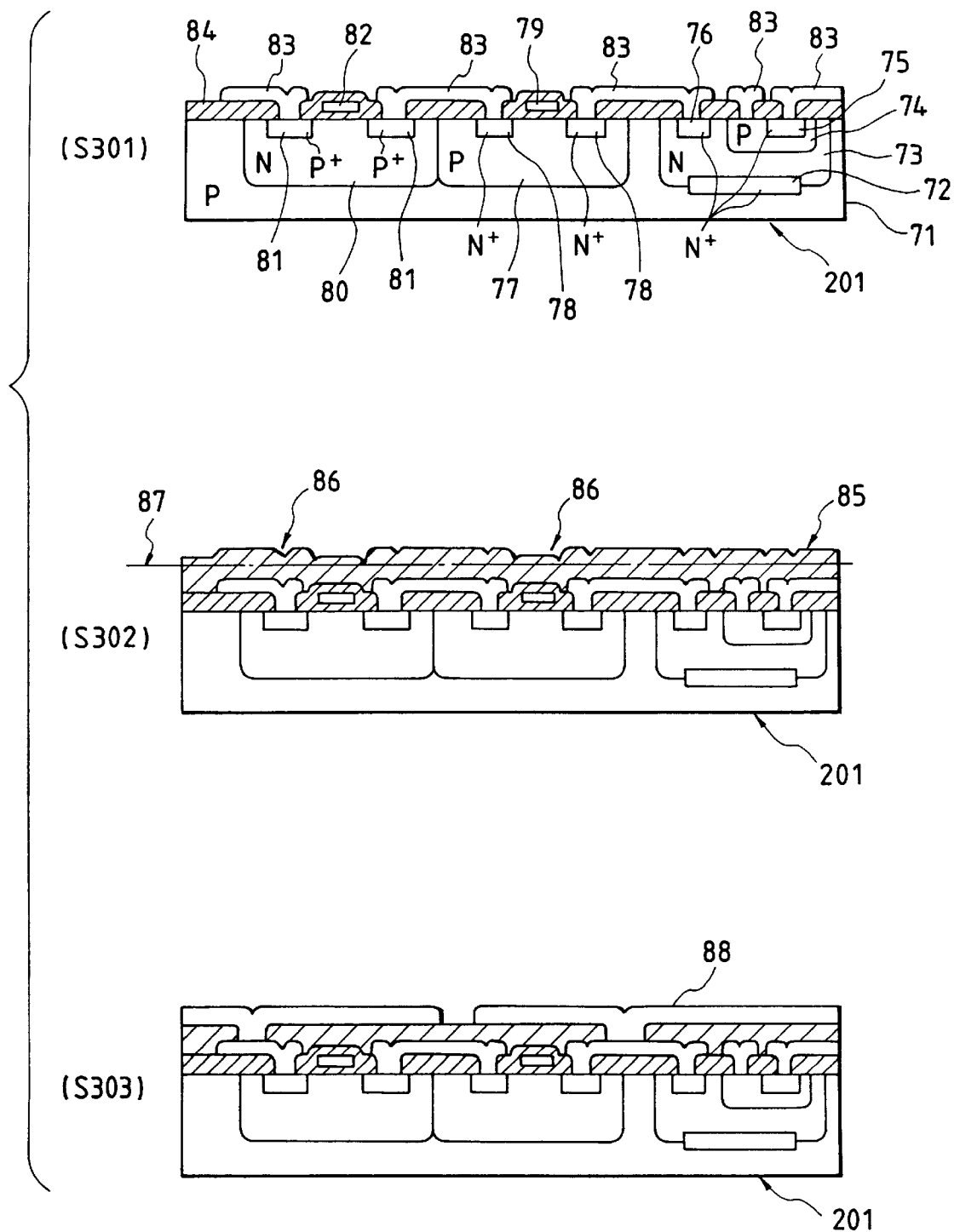
FIG. 9 is a model view showing a semiconductor device manufacturing method according to the present invention.

FIG. 9 is a model view for illustrating a semiconductor device manufacturing process.

A semiconductor layer is formed on the surface of a silicon wafer by gaseous phase epitaxial growth, and N well 80, P well 77, $N^+$ embedded layer 72 and a collector area 73 are formed by ion pouring. Further, a P-type base area 74 is formed. After the formation of gate insulating film, gate electrodes 79 and 82 of polysilicon are formed.

$N^+$ type source drain 78, emitter 75 and collector contact 76 are formed, and $P^+$ type source drain 81 is formed.

Insulating film 84 is formed by the CVD method, and a contact hole is formed by reactive ion etching. Metallic film of aluminum silicon or the like is formed by sputtering or the CVD method, and when it is patterned into a wiring shape, there is obtained wiring 83 (S301).

Thereafter, relatively thick oxide film 85 which provides inter-layer insulating film is formed by the CVD method. This wafer 201 is then thrown into the polishing apparatus having the basic structure as shown in FIG. 1, and the polishing of the oxide film 85 is effected.

The oxide film 85 is removed to a position indicated by the reference numeral 87 by polishing so that recesses 86 in the surface thereof may disappear (S302).

Thereafter, the wafer 201 is taken out of the polishing apparatus via the rinsing and detecting steps shown in FIG. 2.

When the wafer 201 having had its surface polished is thrown into a sputtering apparatus and metallic film of aluminum silicon or the like which provides wiring is formed and is patterned into a wiring shape, there is obtained wiring 88.

If steps S302 and S303 are repeated still thereafter, there can be formed a flat multilayer wiring structure.

While the polishing of the oxide film 85 has been described above, the metallic film which provides wiring may be polished.

Some specific embodiments of the present invention which realize the above-described basic structure will hereinafter be described.

The above-described polishing means, rinsing means and detecting means can be suitably replaced by polishing means, rinsing means and detecting means in each embodiment which will be described hereinafter.

Embodiment 1

Figure 10:
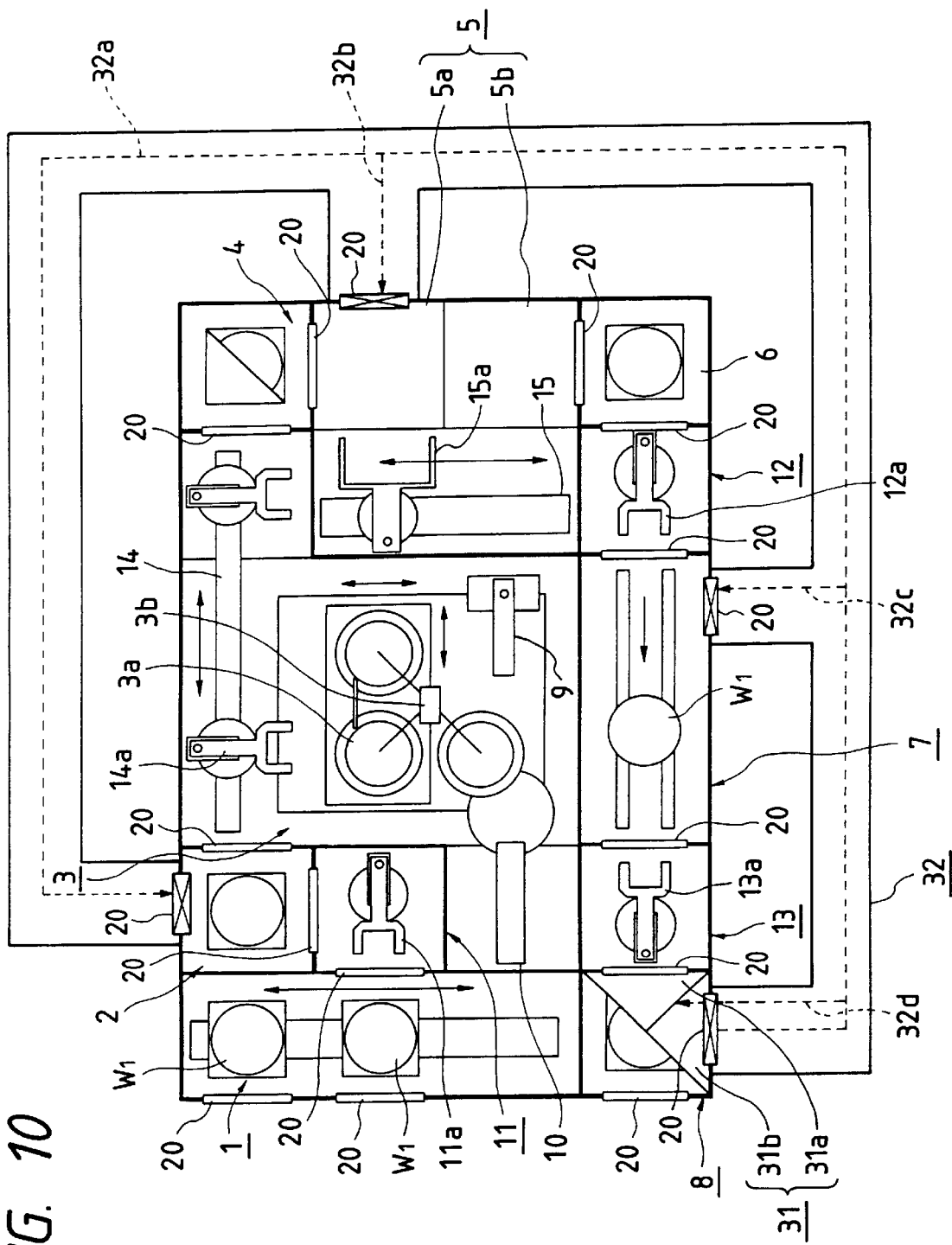
FIG. 10 shows an embodiment of the precision polishing apparatus of the present invention.

FIG. 10 shows a precision polishing apparatus according to Embodiment 1.

This apparatus has a loading unit 1, a wafer stocker unit 2, a polishing unit 3, rinsing units 4 and 5, a dehydrating unit 6, a drying unit 7 and an unloading unit 8. A first unit in the present invention corresponds to the loading unit 1 and/or the wafer stocker unit 2, a second unit corresponds to the polishing unit 3, a third unit corresponds to the rinsing unit 4 and/or the rinsing unit 5, and a fourth unit corresponds to the drying unit 7.

In the present embodiment, the detecting means for detecting the polished state of the wafer is provided in the unloading unit 8.

The loading unit 1 receives a wafer $W_1$ which is a workpiece in a cassette from a conveyor or the like, not shown. The wafer stocker unit 2 effects the centering of the wafer $W_1$ taken out of the loading unit 1 and makes it wait temporarily. The polishing unit 3 holds the wafer $W_1$ so that the polished surface thereof may face upward, and the polished surface of the wafer $W_1$ is polished by polishing pads 3a which are downwardly facing polishing means while slurry is supplied from a slurry supply device 3b. Of the rinsing units 4 and 5, the unit 4 is a pre-rinsing unit which blows rinsing liquid against the wafer $W_1$ after polishing to thereby effect preliminary rinsing. The rinsing unit 5 rinses the wafer $W_1$ by first and second rinsing baths 5a and 5b. The dehydrating unit 6 is a spin dehydrating unit which rotates the wafer $W_1$ to thereby remove any rinsing liquid attaching thereto. The drying unit 7 is a fourth unit which blows cold air or warm air against the wafer $W_1$ to thereby completely dry the wafer. The unloading unit 8 sends out the dried wafer $W_1$ to the next step. The units 1 to 8 each constitute a hermetically sealed chamber in which the atmosphere is hermetically sealed by hermetically sealing means. Opening-closing means 20 such as a gate valve is provided at a location between adjacent units for taking the wafer in and out.

The polishing unit 3 is provided with a plurality of downwardly facing polishing pads 3a as previously described, and these pads are alternately reclaimed by a hand dresser 9. When reclamation is impossible, the polishing pads 3a are interchanged with new polishing pads by a polishing pad interchanging unit 10.

A first transporting robot chamber 11 is provided between the loading unit 1 and the wafer stocker unit 2, and a rotatable type first transporting robot 11a is disposed therein. Likewise, a second transporting robot chamber 12 is provided between the spin dehydrating unit 6 and the drying unit 7, and a rotatable type second transporting robot 12a is disposed therein. A third transporting robot chamber 13 is provided between the drying unit 7 and the unloading unit 8, and a rotatable type third transporting robot 13a is disposed therein. The transporting robots 11a–13a take the wafer out of one unit and into the other unit by the expansion and contraction and vertical movement of their arms.

The first to third transporting robot chambers 11 to 13 are hermetically sealed chambers having their interior atmospheres hermetically sealed. Opening-closing means such as gate valves are provided at the carry-in port and carry-out port for the wafer.

The polishing unit 3 has a fourth transporting robot 14a reciprocally moved along a guide 14 to thereby transport the wafer. The rinsing unit 5 has a rinsing robot 15a for conveying the wafer $W_1$ to first and second rinsing baths 5a and 5b in succession along a guide 15.

The units 1–8 and the hermetically sealed chambers such as the transporting robot chambers 11–13 are all shut off from the atmosphere around the precision polishing apparatus, and opening-closing means 20 are disposed between adjacent hermetically sealed chambers, and the opening and closing of each opening-closing means 20 are done as follows.

When for example, the opening-closing means 20 between the loading unit 1 upstream of the polishing unit 3 and the first transporting robot chamber 11 and between the first transporting robot chamber 11 and the wafer stocker unit 2 are successively opened and closed to convey the wafer $W_1$ toward the polishing unit 3, the atmosphere pressure $P_1$ in the loading unit 1 is first rendered higher than the atmosphere pressure $P_2$ in the first transporting robot chamber 11, and the opening-closing means 20 between the loading unit 1 and the first transporting robot chamber 11 is opened to thereby deliver the wafer $W_1$ to the transporting robot 11a, and then the opening-closing means 20 is closed. Subsequently, in a state in which the atmosphere pressure $P_2$ in the transporting robot chamber 11 is higher than the atmosphere pressure $P_3$ in the wafer stocker unit 2, the opening-closing means 20 therebetween is opened to thereby carry the wafer $W_1$ into the wafer stocker unit 2 and effect the centering or the like of the wafer.

Also when the wafer $W_1$ is to be carried from the wafer stocker unit 2 into the polishing unit 3, the opening-closing means 20 is opened with the atmosphere pressure in the polishing unit 3 rendered lower than the atmosphere pressure in the wafer stocker unit 2, and the wafer $W_1$ is delivered to the fourth transporting robot 14a.

If the pressure in each hermetically sealed chamber is thus set or controlled such that when the opening-closing means 20 between adjacent hermetically sealed chambers are opened, the atmosphere pressure in the hermetically sealed chamber farther from the polishing unit 3 becomes higher, it can be avoided that dust such as polishing powder created in the polishing unit 3 enters the wafer stocker unit 2 and the loading unit 1 or the transporting robot chamber 11, etc. in a large amount.

The opening-closing means 20 disposed downstream of the polishing unit 3 is also controlled so that as described above, the atmosphere pressure in the hermetically sealed chamber farther from the polishing unit 3 may become higher, whereafter the opening-closing means 20 is opened and the delivery of the wafer $W_1$ is done.

To control the atmosphere pressure in each hermetically sealed chamber, an air supply and exhaust port which is an atmosphere pressure control means is provided in each hermetically sealed chamber. When the opening-closing means 20 is opened, clean air is supplied from the air supply and exhaust port in one hermetically sealed chamber, and air is exhausted from the air supply and exhaust port in the other hermetically sealed chamber to thereby provide a pressure difference between the atmospheres in the respective hermetically sealed chambers.

Also, if a slit-like opening or the like is formed in each opening-closing means 20 and air is continuously exhausted from the polishing unit 3, the clean air around the precision polishing apparatus will be sucked into each hermetically sealed chamber, and there will be created such a pressure gradient that the atmosphere pressure will become lower in the hermetically sealed chambers nearer to the polishing unit 3. If the pressure in each hermetically sealed chamber is thus set so that the state in which the atmosphere pressure becomes higher in the hermetically sealed chambers farther from the polishing unit 3 may be maintained at all times, it is unnecessary to control the atmosphere pressure in each hermetically sealed chamber each time the opening-closing means 20 are opened and closed.

The wafer $W_1$ carried into the loading unit 1 by a conveyor or the like, not shown, is transported into the wafer stocker unit 2 by the transporting robot 11a, and the centering of the wafer is done there. Then, the wafer $W_1$ is received onto a containing shelf or the like and is transported to the polishing unit 3 by the fourth transporting robot 14a. The fourth transporting robot 14a carries the wafer $W_1$ while holding the wafer in such a manner that the polished surface thereof faces upward and disposes the wafer on a wafer chuck in the polishing unit 3. The wafer chuck adsorbs and holds the wafer. The downwardly facing polishing pad 3a is moved to above the wafer $W_1$. The polishing surface of the pad 3a is caused to bear against the polished surface of the wafer, and pressure is applied to the pad 3a to rotate the pad 3a, thereby polishing the wafer.

The wafer $W_1$ which has been polished is transported to the pre-rinsing unit 4, by which the wafer is pre-rinsed. Next, the wafer $W_1$ is transported to the rinsing unit 5, where the wafer is rinsed. Then, the dehydration of the wafer is effected in the spin dehydrating unit, and the wafer $W_1$ is transported to the drying unit 7 by the second transporting robot to thereby dry the wafer.

This precision polishing apparatus continuously and automatically effects the steps of carrying, polishing, rinsing and drying the wafer $W_1$. However, when the wafer $W_1$ taken out into the unloading unit 8 is inspected and a defect such as a flaw is detected on the surface of the wafer, if the wafer $W_1$ is sent back to the loading unit 1 and all the above-described steps are repeated, the time spent for the reclamation of the defective wafer $W_1$ will become long and the productivity will become low. Further, the opening and closing operations of the transporting robot chambers 11–13 and the opening-closing means 20 will all be required and the frequency of the driving of these may increase to shorten the life of the apparatus.

So, between the drying unit 7 and the unloading unit 8 or in the unloading unit 8, there is provided an inspection discrimination unit 31 which is a defect inspecting means provided with a defect inspecting device 31a for inspecting the flaw or stain of the polished surface of the wafer $W_1$ and sorting defective articles, and a discriminating device 31b for discriminating whether the defect of the wafer $W_1$ is a flaw remaining on the polished surface or a stain due to polishing byproduct such as polishing powder or rinsing liquid caused by insufficient drying of the wafer.

In the defect inspecting device 31a of the inspection discrimination unit 31, whether there is a flaw or a stain on the polished surface of the wafer $W_1$ is inspected and only wafers free of such a defect are sent out to the unloading unit 8. A wafer $W_1$ which is a defective article is transported to the discriminating device 31b, where it is subjected to the inspection of whether the defect is a flaw of the polished surface or a stain. A wafer $W_1$ of which the defect has been judged by way of such detailed defect inspection is selectively returned to the drying unit 7, the rinsing unit 5 or the wafer stocker unit 2 through a return duct 32 which is a selective return means.

The return duct 32 has a first return path 32a for returning the wafer $W_1$ to the wafer stocker unit 2 to re-polish the wafer when the defect of the wafer $W_1$ detected in the inspection discrimination unit 31 is a flaw of the polished surface, a second return path 32b for returning the wafer $W_1$ to the rinsing unit 5 when the defect of the wafer $W_1$ is judged to be a stain due to remaining polishing byproduct, a third return path 32c for returning the wafer $W_1$ to the drying unit 7 when the defect of the wafer $W_1$ is judged to be a stain due to remaining rinsing liquid, and a fourth return path 32d for returning the wafer $W_1$ to the defect inspecting device 31a to re-inspect the wafer when it is judged that the defect of the wafer $W_1$ is none of the above-mentioned defects. The return duct is designed to return the wafer $W_1$ to a step necessary for the reclamation of the wafer $W_1$ in conformity with the kind of defect of the wafer $W_1$.

The first return path 32a may be directly connected to the polishing unit 3, instead of being connected to the wafer stocker unit 2.

According to the present embodiment, before the wafer is taken out of the unloading unit, the defect of the wafer is inspected and the wafer is automatically returned to the step of removing the defect. Only wafers free of any defect are finally taken out of the unloading unit as products and therefore, there is no possibility of defective articles being included among the wafers sent from the precision polishing apparatus to the next step.

Also, design is made such that a wafer which need not be re-polished like a wafer of which the defect is a flaw of the polished surface is returned to the rinsing step or the drying step downstream of the polishing step. Therefore, problematic reduction in throughput of the precision polishing apparatus due to the unnecessary polishing step or polishing being repeatedly effected because of the creation of a new flaw or stain on the polished surface of the wafer will not occur.

Defective articles are thus efficiently reclaimed to thereby greatly improve the throughput of the wafer polishing step and avoid any defective article being included among the products sent to the next step, thus contributing to the automation of the manufacturing process for semiconductor devices or the like. As a result, the productivity of semiconductor devices or the like can be greatly improved.

Embodiment 2

Figure 11:
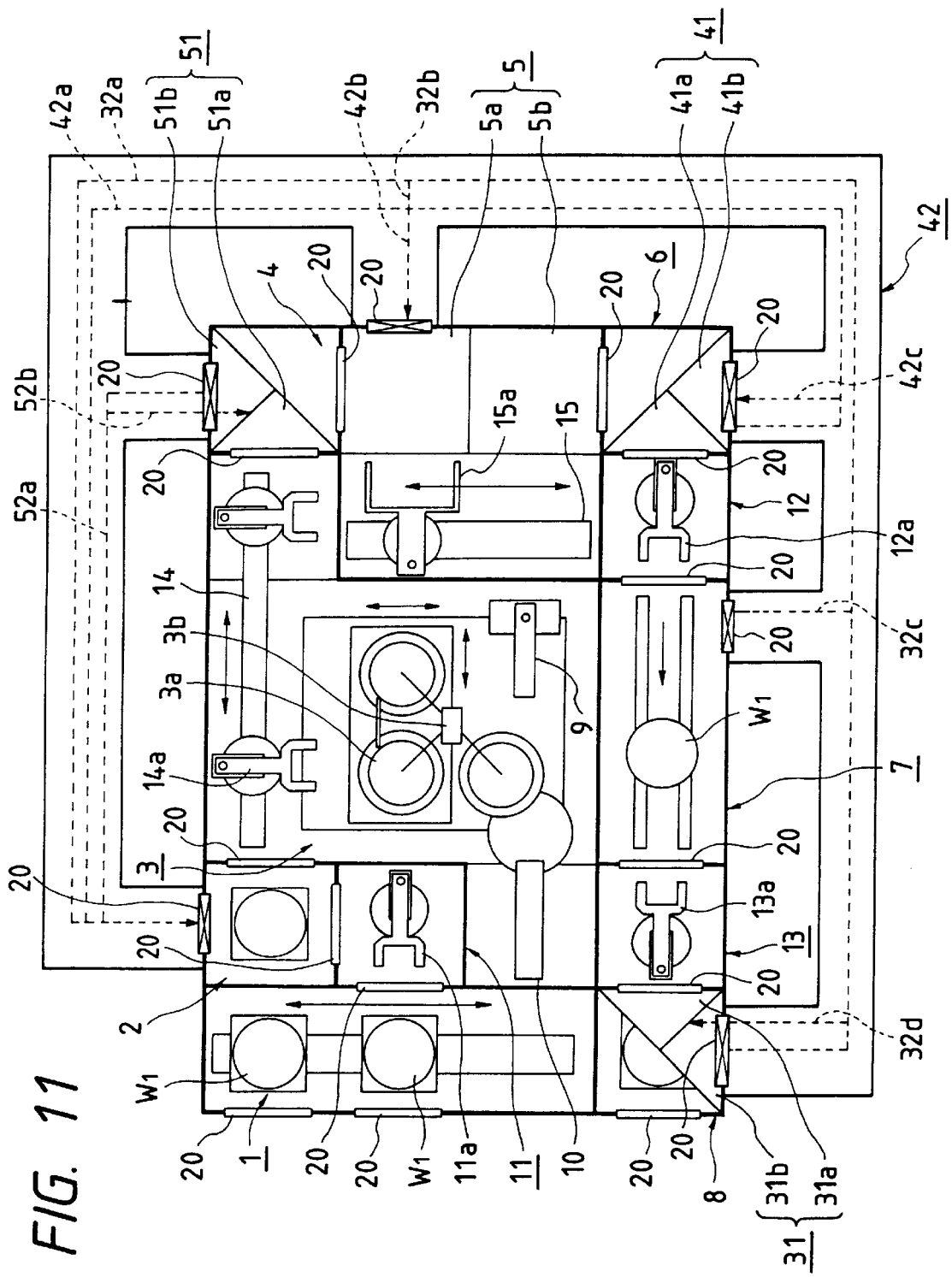
FIG. 11 shows another embodiment of the precision polishing apparatus of the present invention.

FIG. 11 shows another embodiment of the present invention. This embodiment is one in which second and third inspection discrimination units 41 and 51 which are intermediate defect inspecting means similar to the inspection discrimination unit 31 provided between the drying unit 7 and the unloading unit 8 are disposed between the rinsing unit 5 and the drying unit 7 and between the polishing unit 3 and the pre-rinsing unit 4, respectively.

The second inspection discrimination unit 41 has a defect inspecting device 41a for detecting the defect of the wafer $W_1$ after rinsing, and a discriminating device 41b for discriminating whether the defect of a wafer $W_1$ which is an intermediate defective article is a flaw of the polished surface of the wafer $W_1$ or a stain due to polishing powder remaining on the polished surface. If the defect of the wafer $W_1$ is a flaw of the polished surface, the second inspection discrimination unit 41 returns the wafer $W_1$ to the wafer stocker unit 2 through a first return path 42a of a return duct 42 which is intermediate returning means. If the defect of the wafer $W_1$ is a stain due to polishing powder or the like, the second inspection discrimination unit 41 returns the wafer $W_1$ to the rinsing unit 5 through a second return path 42b of the return duct 42. Also, when the defect of the wafer is none of the above, the second inspection discrimination unit 41 returns the wafer $W_1$ to the defect inspecting device 41a through a third return path 42c.

The third inspection discrimination unit 51 has a defect inspecting device 51a for detecting the defect of the polishing surface of the wafer $W_1$ after polished, and a discriminating device 51b for discriminating whether the defect of the wafer $W_1$ which is an intermediate defective article is a flaw of the polished surface of the wafer $W_1$. If the defect of the wafer $W_1$ is a flaw of the polished surface, the third inspection discrimination unit 51 returns the wafer $W_1$ to the wafer stocker unit 2 through a first return path 52a of a return duct 52 which is intermediate returning means. If the defect of the wafer $W_1$ is anything other than that, the third inspection discrimination unit 51 returns the wafer $W_1$ to the defect inspecting device 51a through a second return path 52b of the return duct 52.

If as described above, design is made such that the defect of the wafer is detected after the polishing step and the rinsing step, respectively, and the wafer is returned to the necessary preceding step, the defect of the wafer can be detected earlier. As compared with a case where the defect of the wafer is examined to cope with it after all the steps have been terminated, the average value or the like of the number of steps such as the drying step and the rinsing step per product until the wafer is taken out of the precision polishing apparatus can be greatly curtailed. This can further contribute to the lower price of semiconductor devices.

The above-described embodiment of FIG. 11 is constructed as described above and achieves effects which will be described below.

There can be realized a precision polishing apparatus which is provided with a system for continuously and automatically effecting the polishing, rinsing, etc. of a workpiece such as a wafer and detecting the defect of the product in the apparatus and automatically returning it to a step necessary for the reclamation of the product and which is very high in productivity. Also, there is not the possibility that defective articles are included among the products of the precision polishing apparatus, and this can contribute to the full automation of the manufacturing process for semiconductor devices or the like. This can also greatly contribute to the lower price of semiconductor devices or the like.

Embodiment 3

Figure 12:
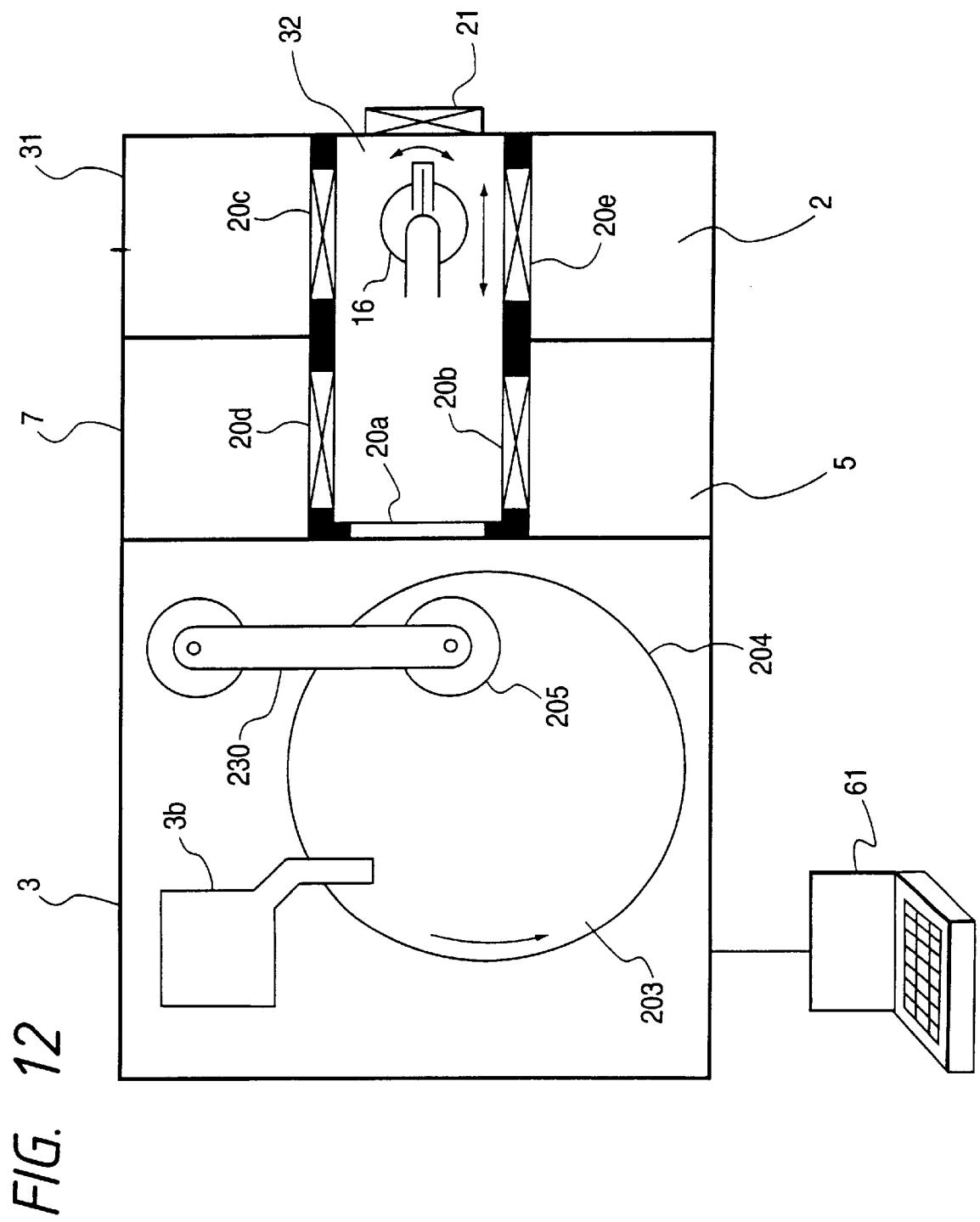
FIG. 12 shows still another embodiment of the precision polishing apparatus of the present invention.

FIG. 12 shows a precision polishing apparatus according to still another embodiment of the present invention.

This apparatus has a polishing unit 3, a rinsing unit 5, a drying unit 7, a detecting unit 31, a wafer stocker 2 and a conveying chamber 32.

The polishing unit 3 has a large-diametered polishing head 204 having a polishing pad attached to the interior of a processing chamber hermetically sealable by opening-closing means 20a, a slurry supplier 3b, a wafer holder 205 and an arm 230 for reciprocally moving the wafer holder.

Figure 13:
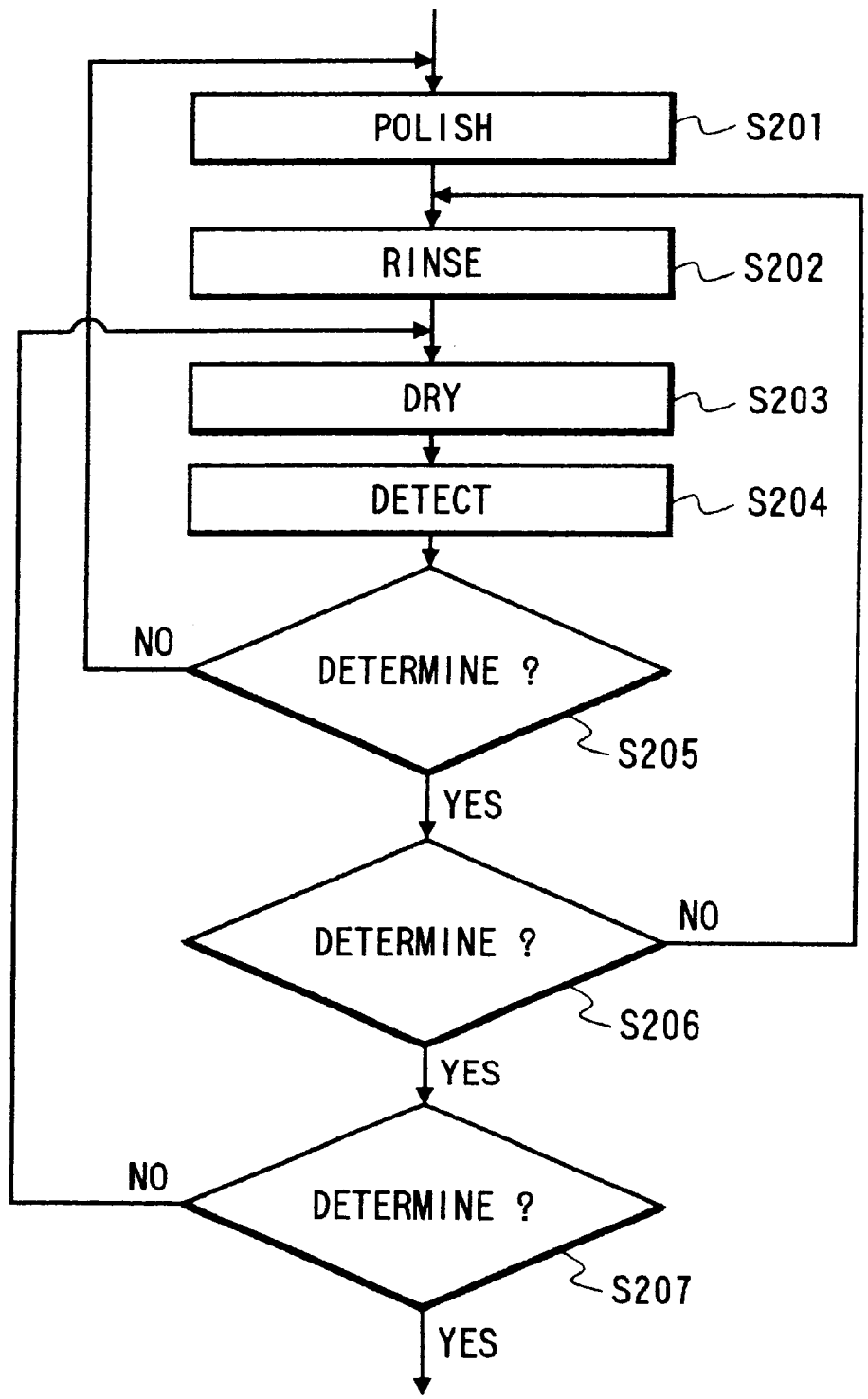
FIG. 13 is a flow chart of a polishing method using the precision polishing apparatus of FIG. 12.
Figure 14:
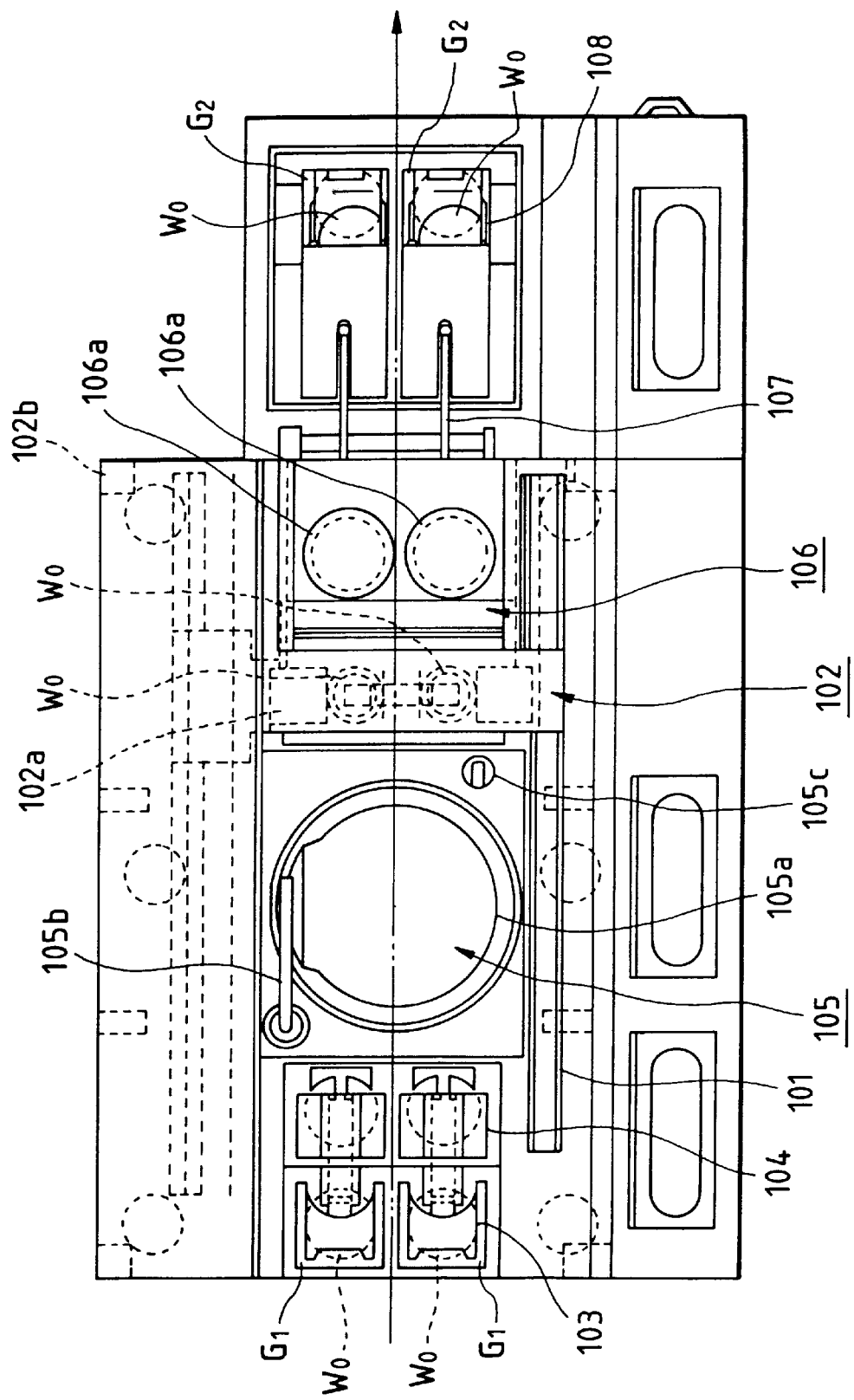
FIG. 14 is a model view of a polishing apparatus according to the prior art.
Figure 15:
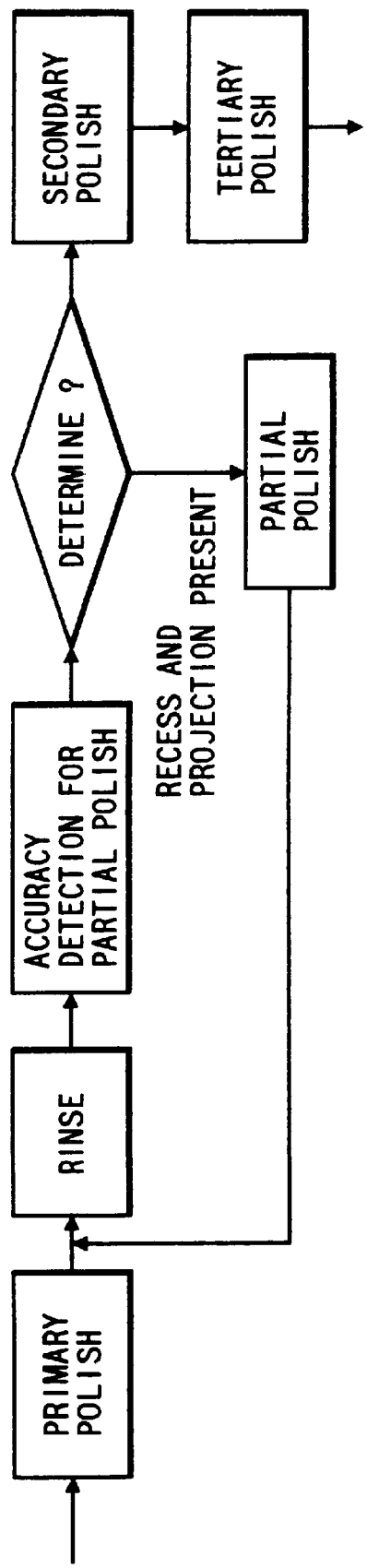
FIG. 15 is a flow chart of a polishing method according to the prior art.
Figure 16:
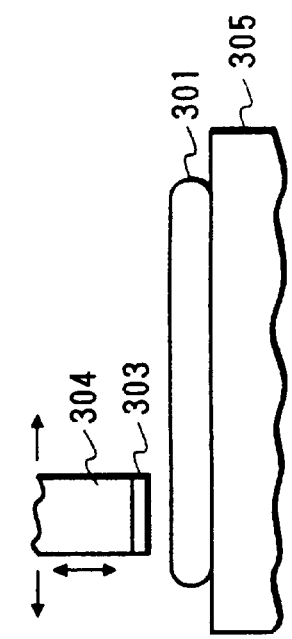
FIG. 16 is a model view of polishing means used in the partial polishing step according to the prior art.

FIG. 13 is a flow chart showing the operation of the polishing apparatus according to the present embodiment which is controlled by a control circuit 61.

Opening-closing means 21 is opened and a wafer is introduced into a conveying chamber 32 by a conveying robot 16. The wafer is held by the wafer holder 205 in the polishing unit 3 through the opening-closing means 20a opened from the conveying chamber 32 with the polished surface thereof turned downward. The opening-closing means 20a is then closed and the holder 205 is lowered while the head 204 is rotated. At this time, slurry is supplied from the slurry supplier 3b onto the pad 203 and also, the polished surface of the wafer is urged against the upper surface of the pad 203. The arm is then reciprocally moved, and the polished surface of the wafer is polished (S201).

When the polishing is completed, the opening-closing means 20a is opened, the wafer is taken out into the conveying chamber 32, and then the opening-closing means 20a is closed. The polished wafer is transported to the rinsing unit with opening-closing means 20b opened, whereafter the opening-closing means 20b is closed. In this rinsing unit 5, the rinsing of the polished surface of the wafer is effected, and the slurry, polishing scraps, etc. on the wafer are removed by wet rinsing (S202).

The wafer after rinsing is once taken out into the conveying chamber 32 with the opening-closing means 20b opened, then opening-closing means 20d is opened and the wafer is sent into the drying unit 7. The opening-closing means 20d is closed, and in the drying unit 7, the polished surface of the wafer is dried. The drying is done with cold air blown against the surface of the wafer from a nozzle (S203).

The wafer after drying is taken out into the conveying chamber 32 with the opening-closing means 20d opened, then opening-closing means 20c is opened and the wafer is transported into the detecting unit 31. In the detecting unit 31, whether a flaw or slurry is present on the polished surface is detected by the use of the aforementioned line sensor (S204). If it is judged that there no flaw or slurry is present, the wafer is now judged by a wafer inspecting device disposed in the detecting unit 31 as to whether the rinsing liquid attaches to the wafer. In this device, a laser beam is applied to the wafer and the regularly reflected light thereof is detected, and whether the mean value of the detection level is within a predetermined range is determined. The portion of the wafer to which the rinsing liquid attaches and the surface of the wafer free of the rinsing liquid differ in the detection level of the regularly reflected light from each other. Therefore, if the values of the two are examined in advance, the two can be distinguished from each other. A wafer judged to be defective at step S205 is returned to the polishing step S201. A wafer judged to have slurry attaching thereto at step S206 is returned to the rinsing step S202 without passing through the polishing step S201.

A wafer judged to have the rinsing liquid attaching thereto at step S207 is returned to step S203 without passing through steps S201 and S202.

Thus, a wafer judged to be free of a flaw or the attachment of the slurry or the rinsing liquid is once taken out into the conveying chamber 32 with the opening-closing means 20c opened and is kept in custody in the stocker 2 with opening-closing means 20e opened.

According to the present invention, polishing or rinsing can be selectively effected again in conformity with the state of the polished surface of a rinsed workpiece. Thus, a workpiece judged to have a flaw is again polished, and a workpiece judged to have slurry only attaching thereto passes again through the rinsing step and subsequent steps without being returned to the polishing unit and therefore, the unnecessary re-polishing step can be eliminated. Thus, precision polishing of high productivity can be accomplished without reducing the throughput.

Also, a workpiece having slurry or a foreign substance only attaching thereto is returned to the rinsing step without being polished. Therefore, it never happens that a new flaw due to a foreign substance is created on the workpiece.

What is claimed is:

1. A method of manufacturing a semiconductor device, comprising forming wiring and interlayer insulating film on a substrate on which a semiconductor element is formed, wherein polishing is effected by the use of a precision polishing apparatus after a film, which becomes the wiring or the interlayer insulating film, is formed, and wherein the precision polishing apparatus comprises a polishing unit having polishing means for polishing the film which is formed on the substrate, a removing unit for removing a stain on a polished surface of the film which is formed on the substrate transported from the polishing unit, detecting means for detecting a state of the polished surface of the film which is formed on the substrate operated upon the removing unit, and selectively returning means for selectively returning the film which is formed on the substrate to the polishing unit or the removing unit in conformity with the result of the detection by the removing unit in conformity with the result of the detection by the detecting means.

2. A method of manufacturing a semiconductor device according to claim 1, wherein after said film is polished, said film is again polished.

3. A method of manufacturing a semiconductor device according to claim 1, wherein the stain on the polished surface is at least one caused by particle, waste, smear or flaw.

4. A method of manufacturing a semiconductor device having wiring or interlayer insulating film, comprising the steps of:

polishing a film for the wiring or the interlayer insulating film provided on a substrate;

removing a stain on the film on the substrate having passed through the polishing step;

detecting a state of the film on the substrate having passed through the removing step; and returning the substrate having the film to the polishing step or the removing step depending on the result of the detection in the detecting step.

5. A method of manufacturing a semiconductor device according to claim 4, wherein the stain is at least one caused by paritcle, waste, smear of flaw.

* * * * *

UNITED STATES PATENT AND TRADEMARK OFFICE
CERTIFICATE OF CORRECTION

PATENT NO. : 6,165,050
DATED : December 26, 2000
INVENTOR(S) : Mikichi Ban et al.

It is certified that error appears in the above-identified patent and that said Letters Patent is hereby corrected as shown below:

Column 1,
Line 20, "submicron" should read -- the submicron --; and
Line 26, "mechanochemical" should read -- mechano-chemical --.

Column 4,
Line 51, "rinsing" should read -- or rinsing --.

Column 6,
Line 12, "thus" should read -- the --.

Column 8,
Line 40, "determined" should read -- identified --.

Column 13,
Line 32, "ing" should read -- ed --; and
"polished," should read -- polishing, --.

Column 14,
Line 52, "there" should be deleted.

Column 16,
Line 4, "upon" should read -- upon by --; and
Line 31, "paritcle," should read -- particle, --; and
"of" should read -- or --.

Signed and Sealed this

Twenty-seventh Day of November, 2001

Attest:

*Nicholas P. Godici*

NICHOLAS P. GODICI
*Attesting Officer*  *Acting Director of the United States Patent and Trademark Office*